United States Patent
Abraham et al.

(10) Patent No.: US 8,835,889 B1
(45) Date of Patent: Sep. 16, 2014

(54) PARALLEL SHUNT PATHS IN THERMALLY ASSISTED MAGNETIC MEMORY CELLS

(71) Applicant: International Business Machines Corporation, Armonk, NY (US)

(72) Inventors: David W. Abraham, Croton, NY (US); John K. De Brosse, Colchester, VT (US); Philip L. Trouilloud, Norwood, NJ (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/800,966

(22) Filed: Mar. 13, 2013

(51) Int. Cl.
*H01L 45/00* (2006.01)
*H01L 43/02* (2006.01)
*H01L 43/12* (2006.01)
*H01L 27/22* (2006.01)

(52) U.S. Cl.
CPC ............... *H01L 43/02* (2013.01); *H01L 27/222* (2013.01); *H01L 43/12* (2013.01)
USPC .............................................. 257/2; 257/295

(58) Field of Classification Search
CPC ...... H01L 27/22; H01L 27/222; H01L 27/249; H01L 27/2453; H01I 27/222
USPC ........................ 257/E29.323, E21.665, 2, 295
See application file for complete search history.

(56) References Cited

U.S. PATENT DOCUMENTS

| | | | |
|---|---|---|---|
| 6,704,220 B2 * | 3/2004 | Leuschner | ................... 365/173 |
| 7,397,077 B2 | 7/2008 | Nickel | |
| 7,583,527 B2 | 9/2009 | Duch et al. | |
| 7,903,454 B2 | 3/2011 | Gogl et al. | |
| 2006/0181813 A1 | 8/2006 | Fukuzumi | |
| 2009/0251950 A1 | 10/2009 | Klostermann | |
| 2011/0149646 A1 | 6/2011 | Liu et al. | |

* cited by examiner

*Primary Examiner* — William D Coleman
(74) *Attorney, Agent, or Firm* — Cantor Colburn LLP; Vazken Alexanian

(57) ABSTRACT

A thermally assisted magnetic memory cell device includes a substrate, a first electrode disposed on the substrate, a magnetic tunnel junction disposed on the first electrode, a second electrode disposed on the magnetic tunnel junction, a conductive hard mask disposed on the second electrode and a parallel shunt path coupled to the magnetic tunnel junction, thereby electrically coupling the first and second electrodes.

14 Claims, 13 Drawing Sheets

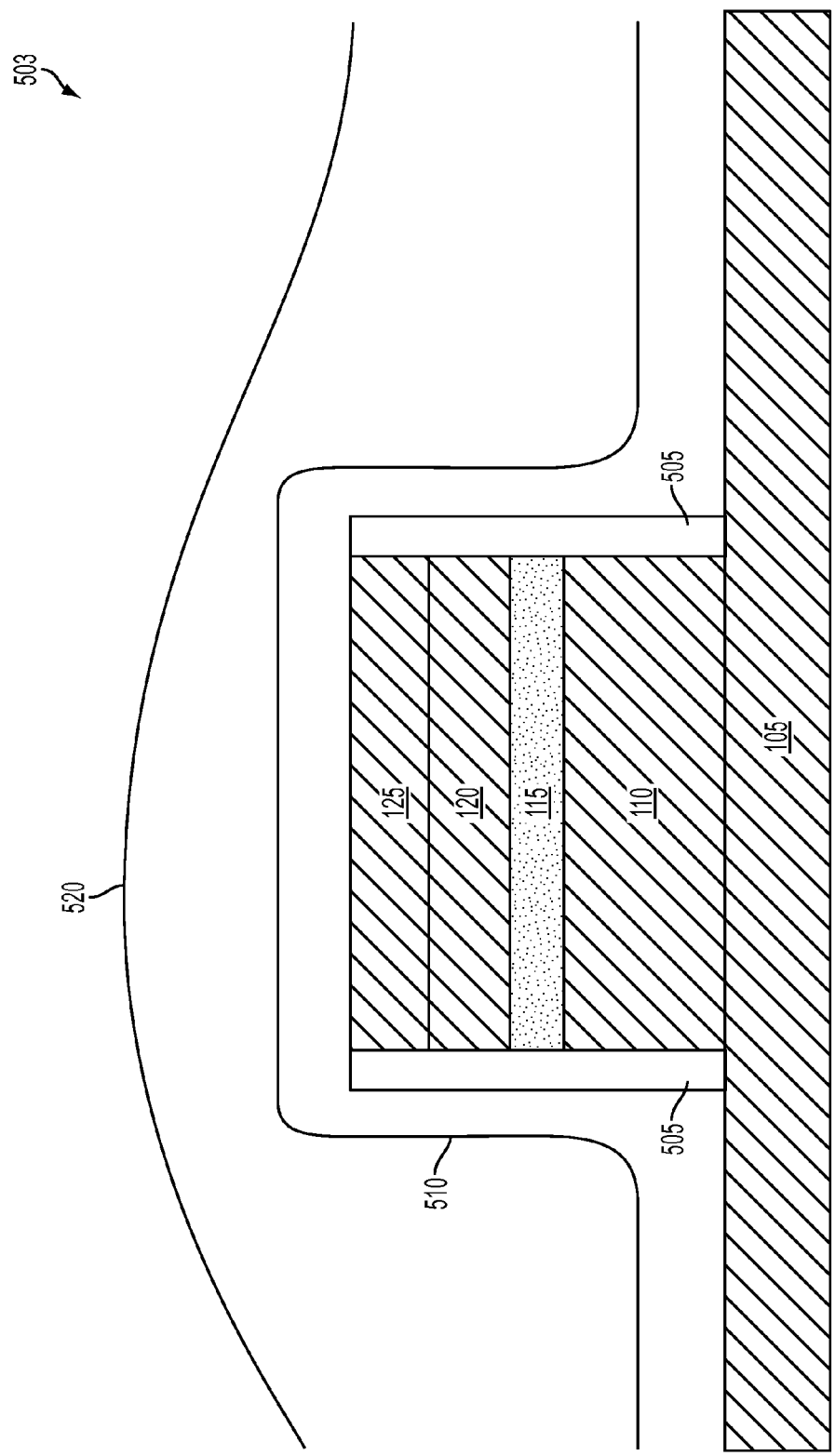

PARALLEL SHUNT PATHS IN THERMALLY ASSISTED MAGNETIC MEMORY CELLS

BACKGROUND

The present invention relates to magnetic memory cells, and more specifically, to devices and methods for fabricating a parallel shunt path that reduces voltage biases in thermally assisted magnetic memory cells.

Switching of magnetic solid state memory devices (i.e., magnetoresistive random access memory (MRAM)) requires significant amounts of electrical current, either in the write lines (to produce magnetic fields) or through the device itself (using the current to switch via spin torque). In particular, as the device size is scaled down (for field MRAM) the current required to produce fields are too large to be sustained by the field-producing wires. For spin-torque devices, the required switching currents and voltages are large enough that device breakdown can occur too close to the switching threshold to ensure that all devices in the array switch without causing damage.

Heating the device can be advantageous in that the selected (heated) device changes properties in such a way as to reduce the switching field or current substantially. This reduction can arise due to a change in the properties of the magnetic films, or through a reduction in the exchange interaction between the pinning antiferromagnet and the magnetic films. Several schemes for heating a magnetic tunnel-junction (MTJ) device have been discussed. A common conventional method for heating MTJs is passing a current through the tunnel junction itself. However, in order to attain sufficient heating (typically of order hundreds of degree temperature rise), a constraint occurs in that the barrier breaks down before sufficient temperature rise is obtained.

Significant work has been done in order to reduce the required temperature for operation, to increase the temperature rise obtained by a given power and to increase the voltage breakdown limit in order to increase the available power. However, it is desirable to have higher temperatures achievable without endangering the integrity of the tunnel junction barrier, for example to have a wider range of operating temperatures.

SUMMARY

Exemplary embodiments include a thermally assisted magnetic memory cell device, including a substrate, a first electrode disposed on the substrate, a magnetic tunnel junction disposed on the first electrode, a second electrode disposed on the magnetic tunnel junction, a conductive hard mask disposed on the second electrode and a parallel shunt path coupled to the magnetic tunnel junction, thereby electrically coupling the first and second electrodes.

Additional exemplary embodiments include a thermally assisted magnetic memory cell device, including a magnetic tunnel junction structure, a parallel shunt path coupled to the magnetic tunnel junction structure and a contact electrically coupled to the magnetic tunnel junction structure and to the parallel shunt path.

Further exemplary embodiments include a method of fabricating a thermally assisted memory cell, the method including patterning a magnetic tunnel junction structure on a substrate, depositing a thermally conductive layer over the magnetic tunnel junction structure to form a parallel shunt path and coupling an electrical contact to the thermally conductive layer and the magnetic tunnel junction structure.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 5D illustrates an intermediate structure of a thermally assisted magnetic memory cell;

DETAILED DESCRIPTION

In exemplary embodiments, the systems and methods described herein implement a shunt path that carries current in parallel with that which flows in the magnetic device, and thus provides additional heating for a magnetic memory cell, and thereby preventing applying a voltage to the tunnel junction which is high enough to cause breakdown of the barrier. As such, the magnetic memory device is electrically heated by both the tunnel junction and also indirectly, via the parallel shunt path. In exemplary embodiments, the parallel shunt path is formed around the magnetic device and acts as a non-magnetic resistor. As such, the parallel shunt path reduces the required bias voltage on the magnetic memory device to achieve a certain temperature. It will be appreciated that the parallel shunt path arrangement can reduce magneto-resistance. The magneto-resistance should be high enough to give a good read-out signal, however it should not be too high as that increases the voltage needed for heating when in the high resistance state. An added advantage of the electrical shunt is to reduce the difference in voltages needed to heat from the low resistance and from the high resistance memory states. As such, the tradeoff between heating and reduced magnetoresistance does not interfere significantly with the memory device operation. It will be appreciated that the systems and methods described herein provide localized heat in close proximity to the tunnel junction, thereby attaining the highest temperature per watt. Conventional methods of heating, such as heating through wires, do not work well because the provided heat is not localized enough.

Figure 1:
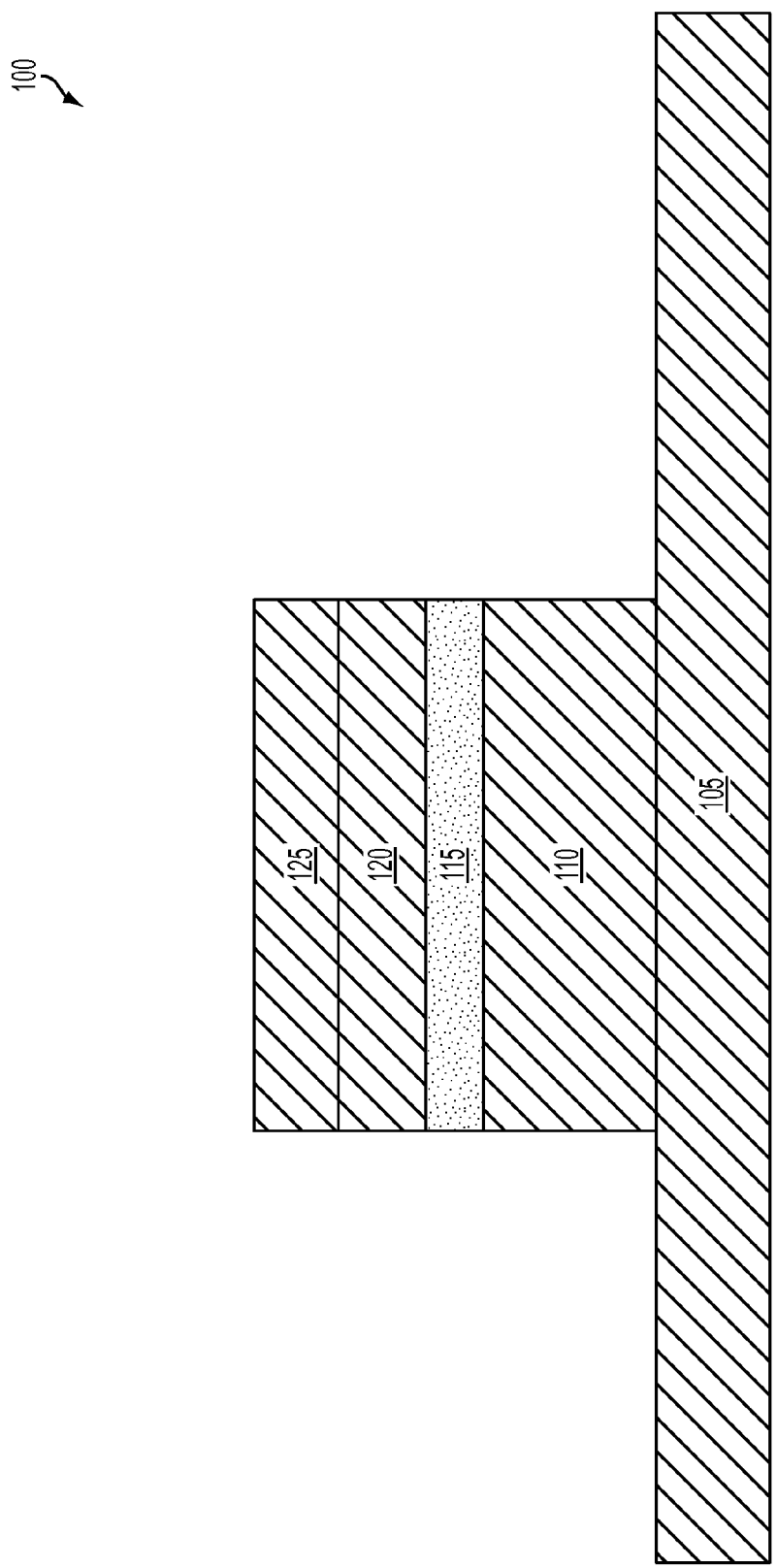
FIG. 1 illustrates an MTJ device on which an exemplary parallel shunt path can be fabricated for thermal assistance.

FIG. 1 illustrates an MTJ device 100 in which an exemplary parallel shunt path can be fabricated for thermal assistance as described herein. The MTJ device 100 includes a substrate 105 and a bottom electrode 110 disposed on the substrate 105. The MTJ device further includes a tunnel junction 115 disposed on the bottom electrode 110, and a top electrode 120 disposed on the tunnel junction 115. The MTJ device 100 further includes and a conductive hard mask 125 disposed on the top electrode 120. In the example of FIG. 1 the substrate 105 can be any suitable substrate such as a semiconductor (e.g., silicon (Si)). The top and bottom electrodes 110, 120 can be any suitable conductive material such as a metal (e.g., aluminum (Al), copper (Cu) and the like). The tunnel junction 115 can be any suitable tunneling material such as, but not limited to, magnesium oxide ($MgO_x$) sandwiched between two ferromagnetic layers such as, but not limited to an alloy of cobalt, iron and boron (CoFeB). In addition, the conductive hard mask 125 can be any suitable conductor such as, but not limited to, a metal containing conductor or a metal silicide. It will be appreciated that the MTJ device 100 shown in FIG. 1 is only an illustrative example and that other device types and arrangements are contemplated in other exemplary embodiments.

In exemplary embodiments, the systems and methods described herein implement a shunt path over the patterned device. A conductive layer is deposited over, for example, the MTJ device 100 of FIG. 1. Directly depositing the conductive layer after the MTJ has been patterned forms a conductive path from the top electrode 120 to the bottom electrode 110 and a shunt through a small volume of the conductive layer as further described herein.

Figure 2:
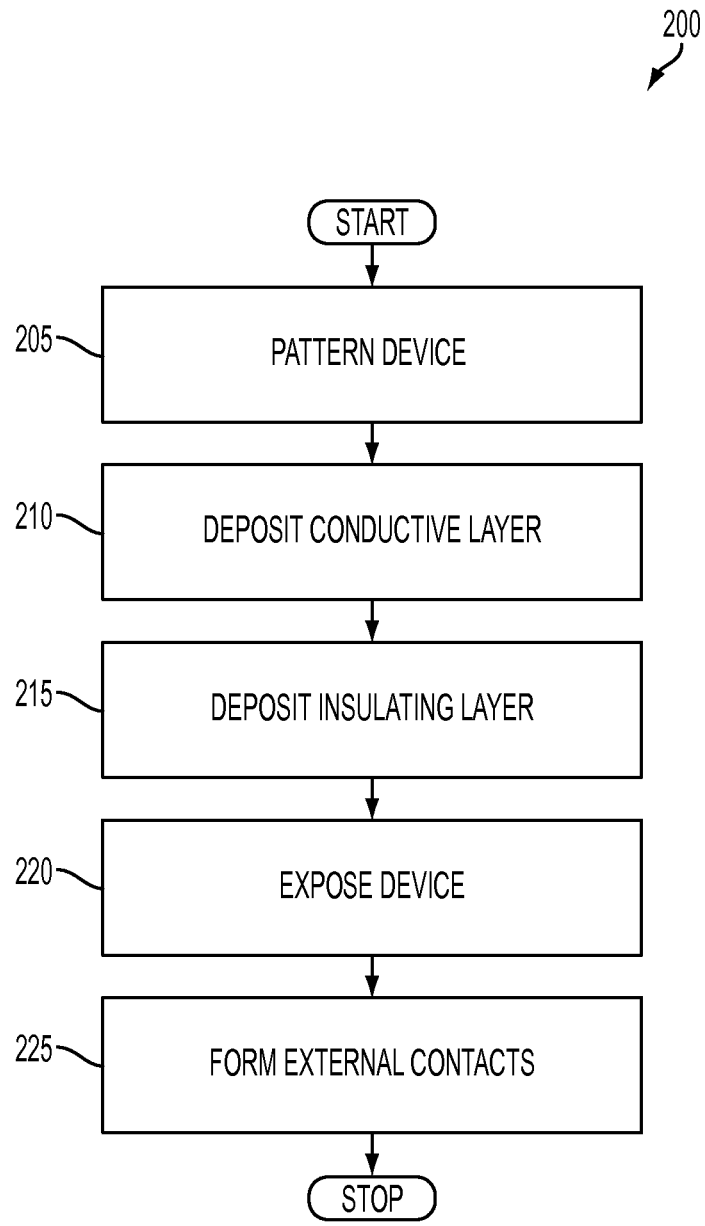
FIG. 2 illustrates a flow chart for a method of fabricating a parallel shunt path in thermally assisted magnetic memory cells in accordance with exemplary embodiments.
Figure 3A:
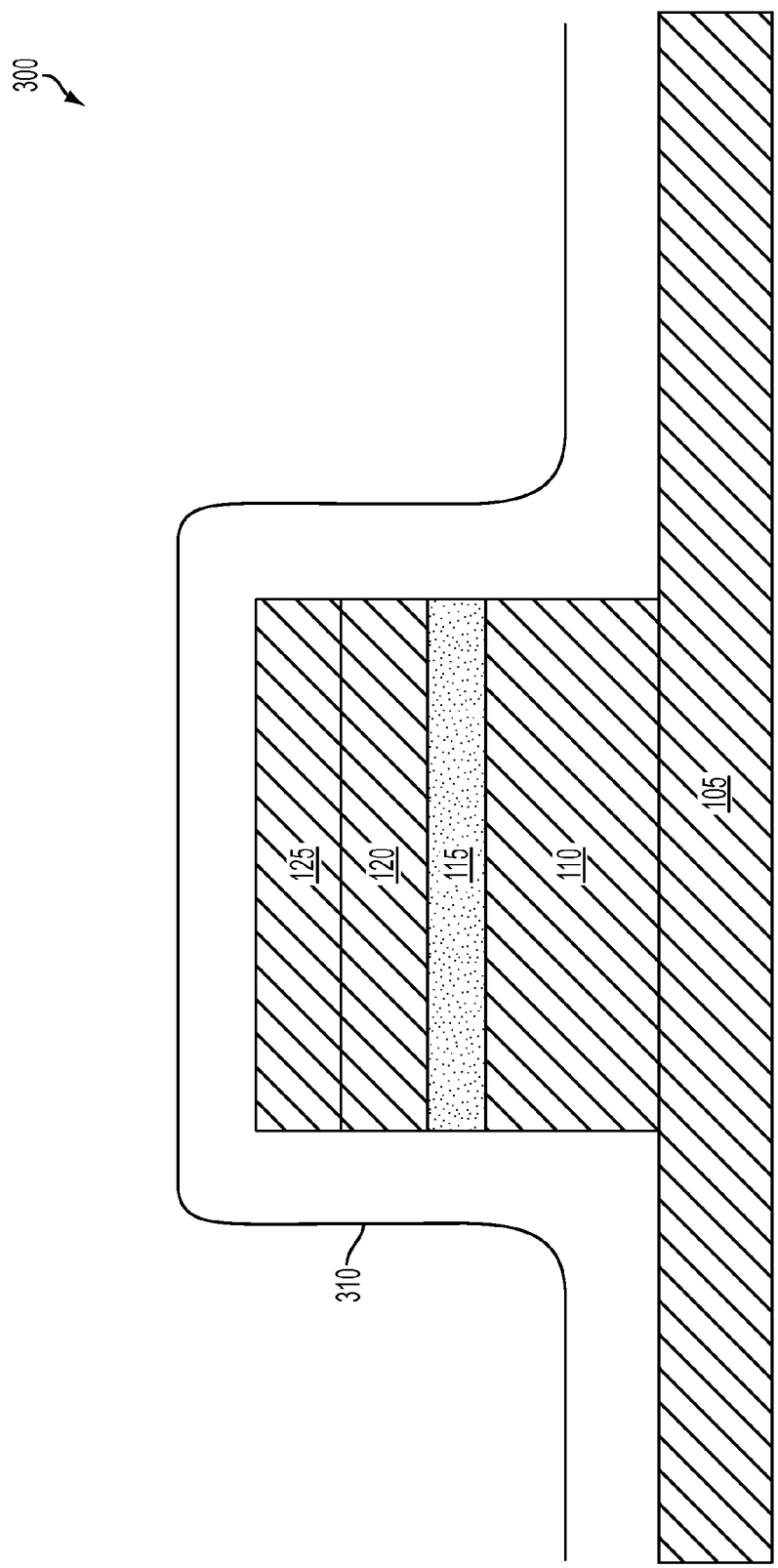
FIG. 3A illustrates an intermediate structure of a thermally assisted magnetic memory cell.
Figure 3B:
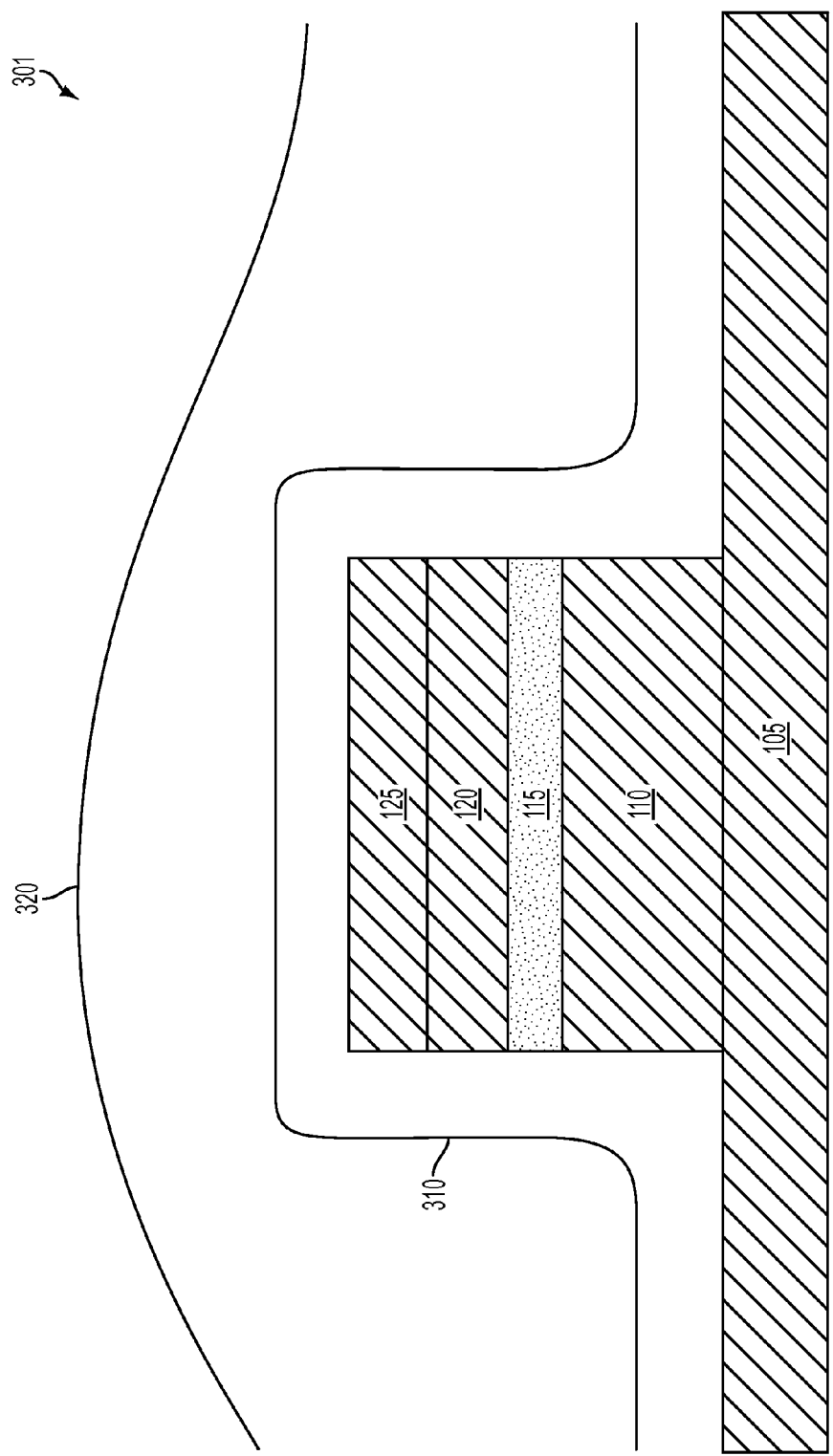
FIG. 3B illustrates an intermediate structure of a thermally assisted magnetic memory cell.
Figure 3C:
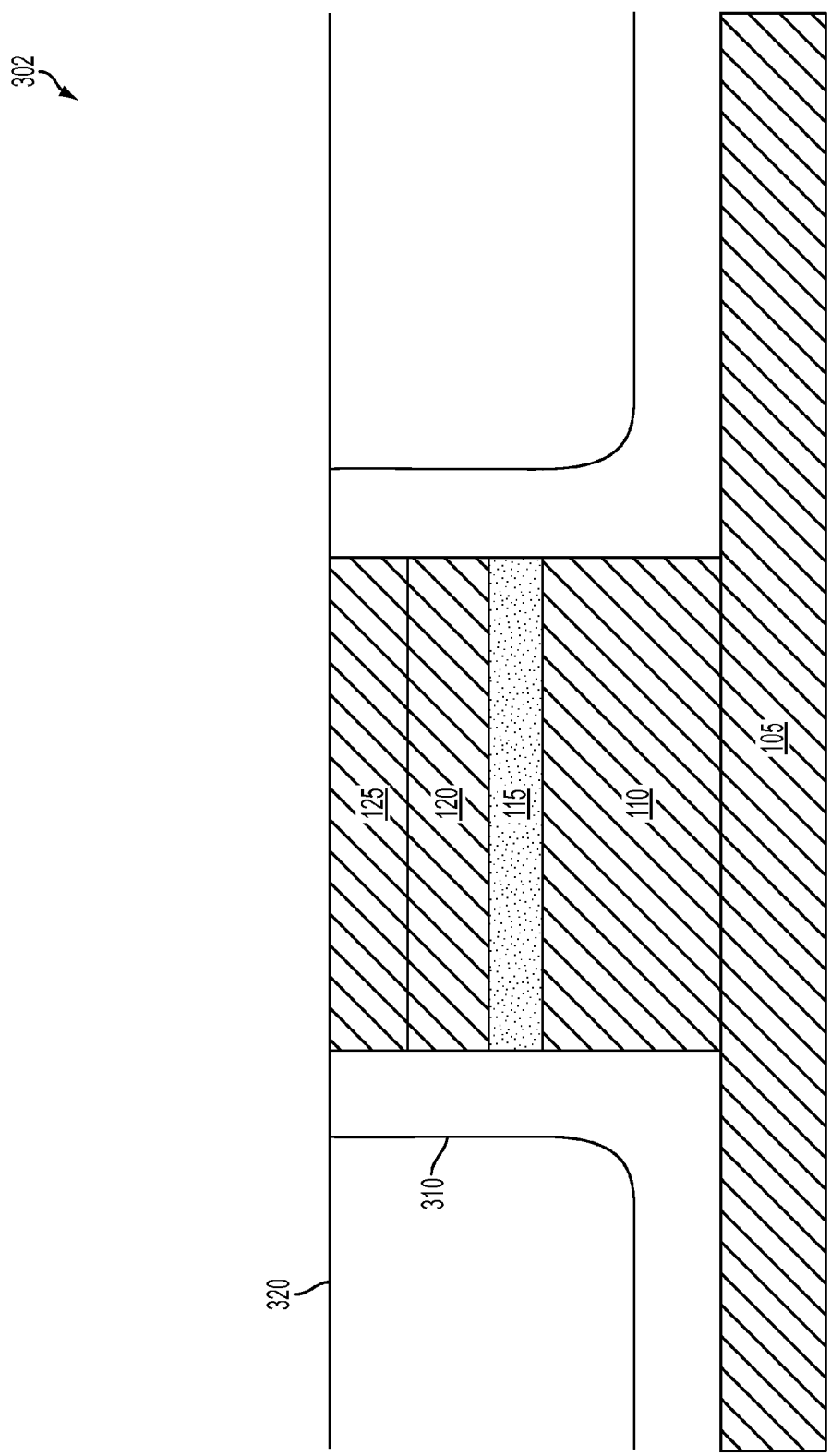
FIG. 3C is an intermediate structure of a thermally assisted magnetic memory cell.
Figure 3D:
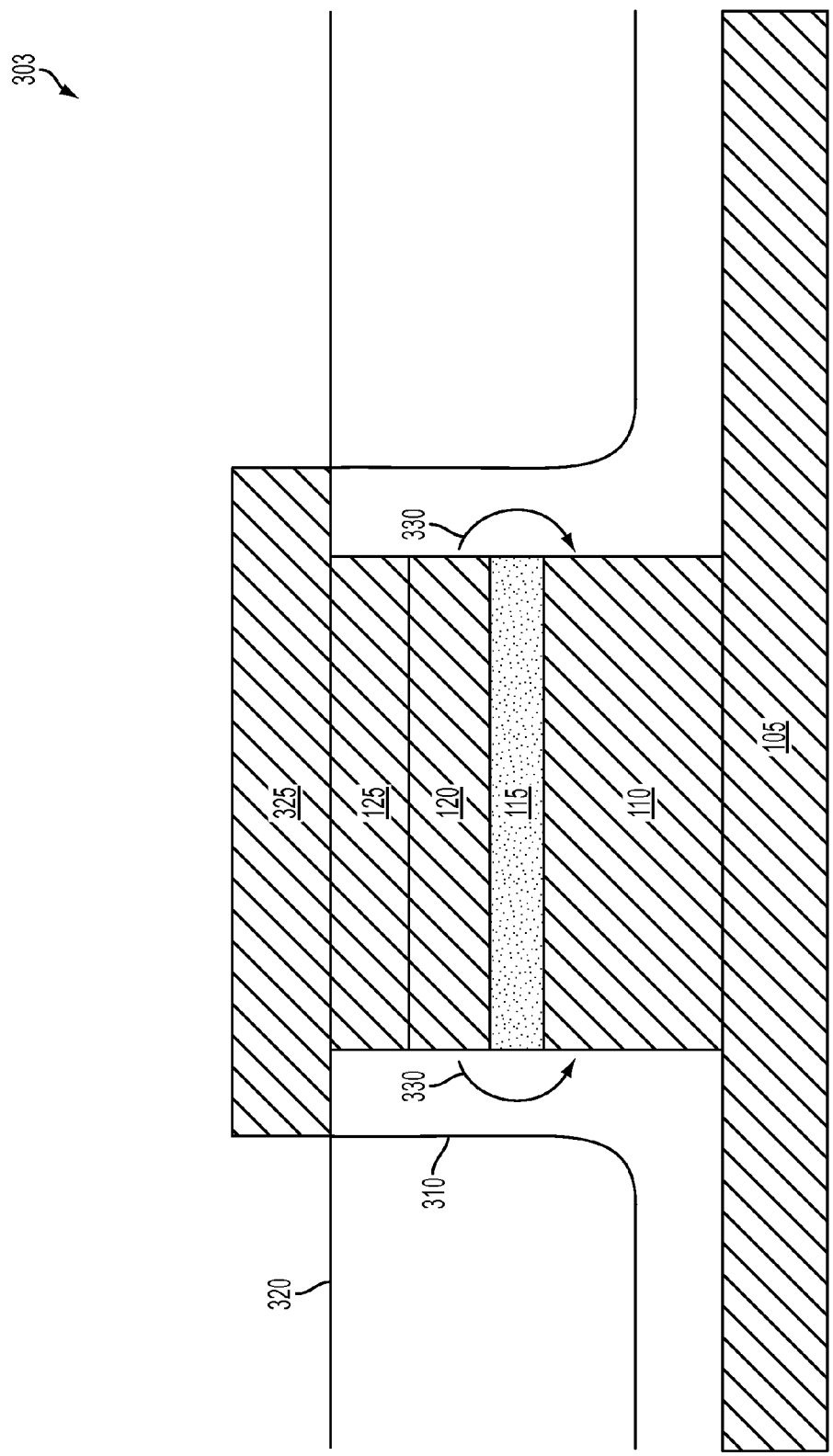
FIG. 3D illustrates a final structure of a thermally assisted magnetic memory cell.

FIG. 2 illustrates a flow chart for a method 200 of fabricating a parallel shunt path in thermally assisted magnetic memory cells in accordance with exemplary embodiments. At block 205, the device (e.g., the MTJ device 100) is patterned according to design specifications for the particular implementation. FIG. 1 illustrates the example of the MTJ device 100 that can be patterned. At block 210, a shorting conductive layer is deposited over the device 100. FIG. 3A illustrates an intermediate structure 300 after the shorting conductive layer 310 is deposited. Exemplary materials which may be used for the shorting conductive layer 310 are SiX, TaX or TiX, where the X content is adjusted in order to choose the resistivity of the shunt material. X is a material such as nitrogen or other materials. At block 215, an insulating layer is deposited over the shorting conductive layer 310 to fill the structure 300. FIG. 3B illustrates an intermediate structure 301 after the insulating layer 320 is deposited over the shorting conductive layer 310. Similar to the shorting conductive layer 310, the insulating material for the insulating layer 320 would be chosen from a similar set of materials, but of composition so that the resistance of the material was much higher than the shunt material. At block 220, the device is exposed to form electrical access to the conductive hard mask 125. For example, at block 220, chemical mechanical polishing/planarization (CMP) can be implemented to smooth the shorting conductive layer 310 and the insulating layer 320 with the combination of chemical and mechanical forces (e.g., a hybrid of chemical etching and free abrasive polishing). FIG. 3C is an intermediate structure 302 after the shorting conductive layer 310 and the insulating layer 320 have been smoothed. At block 225, external contacts can be made to the MTJ device 100. FIG. 3D illustrates a final structure 303 after an external contact 325 has been made to both the conductive hard mask 125 and the shorting conductive layer 310.

In exemplary embodiments, the resistance R given by the parallel combination of the tunnel junction resistance and a non-magnetic shunt resistance is lower than the tunnel junction resistance, and is given by Rtj*(Rsh/(Rsh+Rtj)). Here, Rsh is the shunt resistance and Rtj is the tunnel junction resistance. As such, R then depends on whether the junction is in the high or low resistance state (1 and 0 respectively). The heat generated by a given bias voltage V is then increased since the power output is V*V/R. At the same time, the magnetoresistance observed in the parallel combination resistance R is smaller than the native magnetoresistance of the tunnel junction, and is given by MR'=MR*Rsh/(Rsh+Rtj*(1+MR)). Here, MR' is the effective magnetoresistance of the shunted TJ, MR is the native MR of the TJ, and Rtj is the TJ resistance in the parallel (i.e. low-resistance) state. To summarize, for the same V applied, the heat is increased by a factor of 1+Rtjx/Rsh, where x could represent the 0 or 1 state, whereas the MR is decreased by a similar factor of 1/(1+Rtj1/Rsh).

In the example structure shown in FIG. 3D, the shunt path is shown by arrows 330. In the example, the shunt resistance is determined by the material in the vicinity of the edge of the tunnel junction barrier 315. The shunt resistance is then not determined by geometry but rather the electrical conductivity of the shunt material in the shorting conductive layer 310. It can be appreciated that the current through the shunt path is localized to the barrier region. In other exemplary embodiments, the current through the shunt path can be distributed over a larger region in the device as now described.

Figure 4:
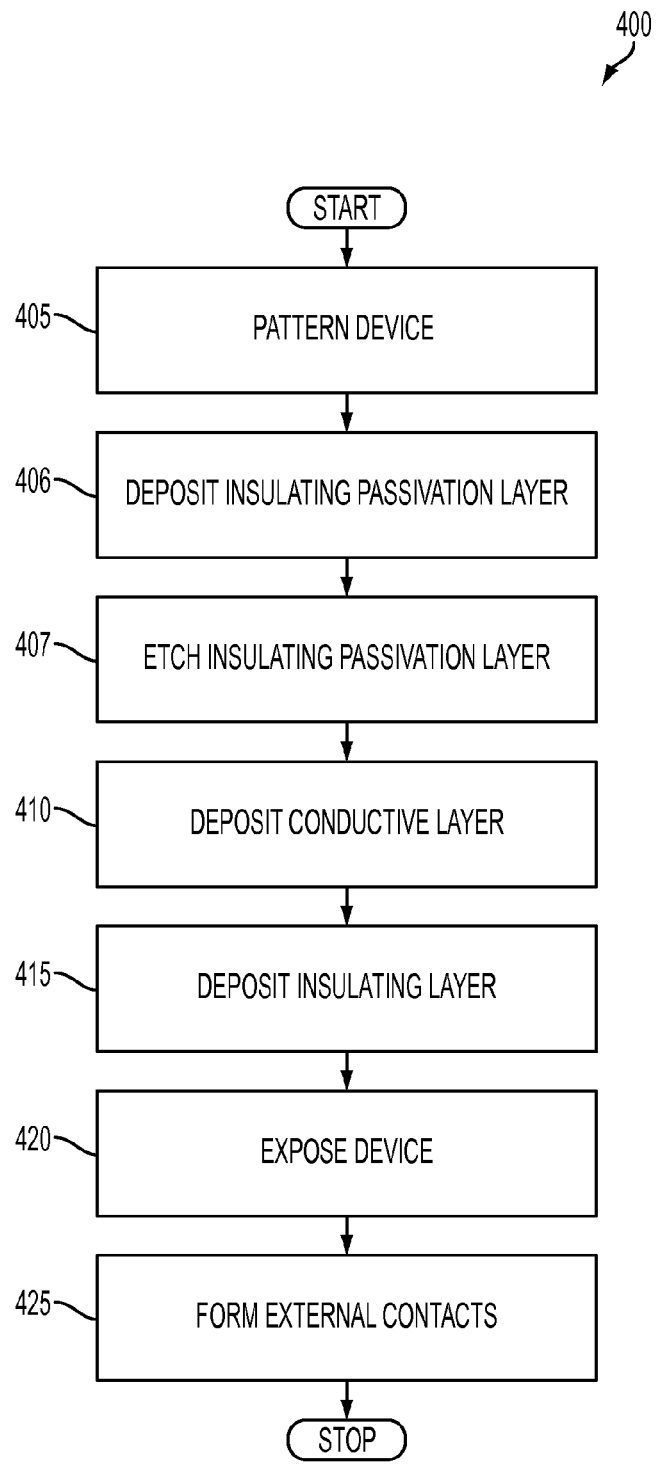
FIG. 4 illustrates a flow chart for a method of fabricating a parallel shunt path in thermally assisted magnetic memory cells in accordance with exemplary embodiments.
Figure 5A:
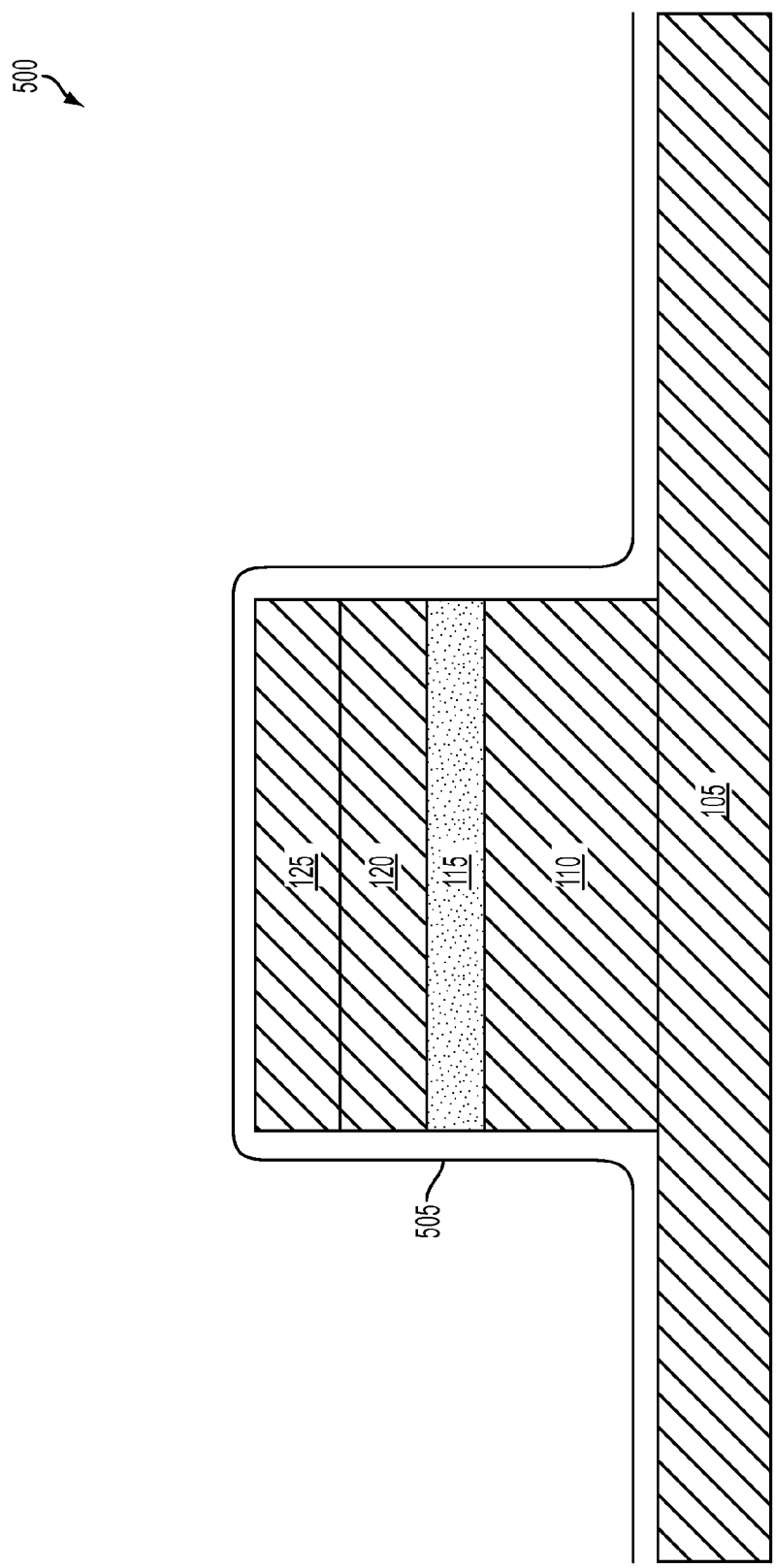
FIG. 5A illustrates an intermediate structure of a thermally assisted magnetic memory cell.
Figure 5B:
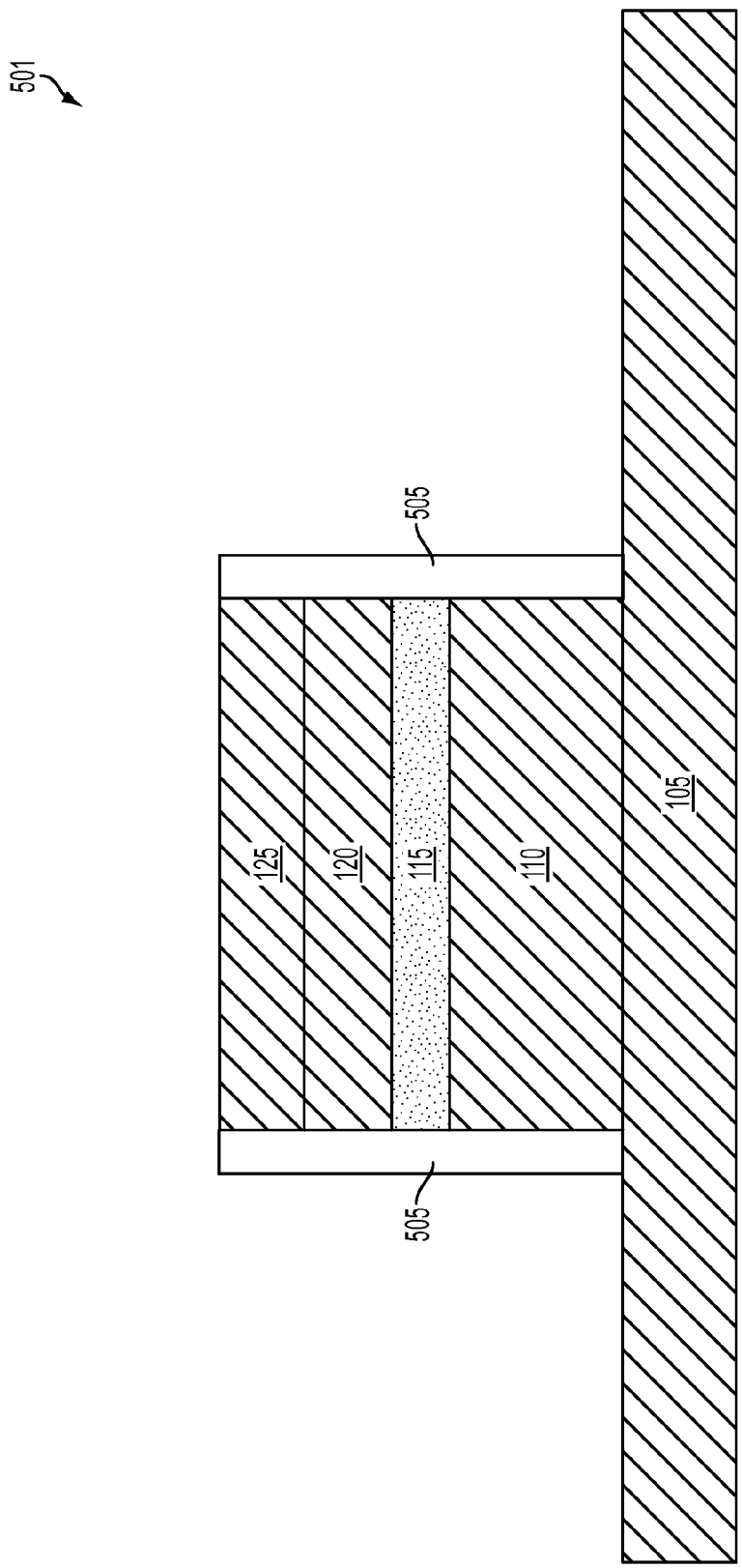
FIG. 5B illustrates an intermediate structure of a thermally assisted magnetic memory cell.
Figure 5C:
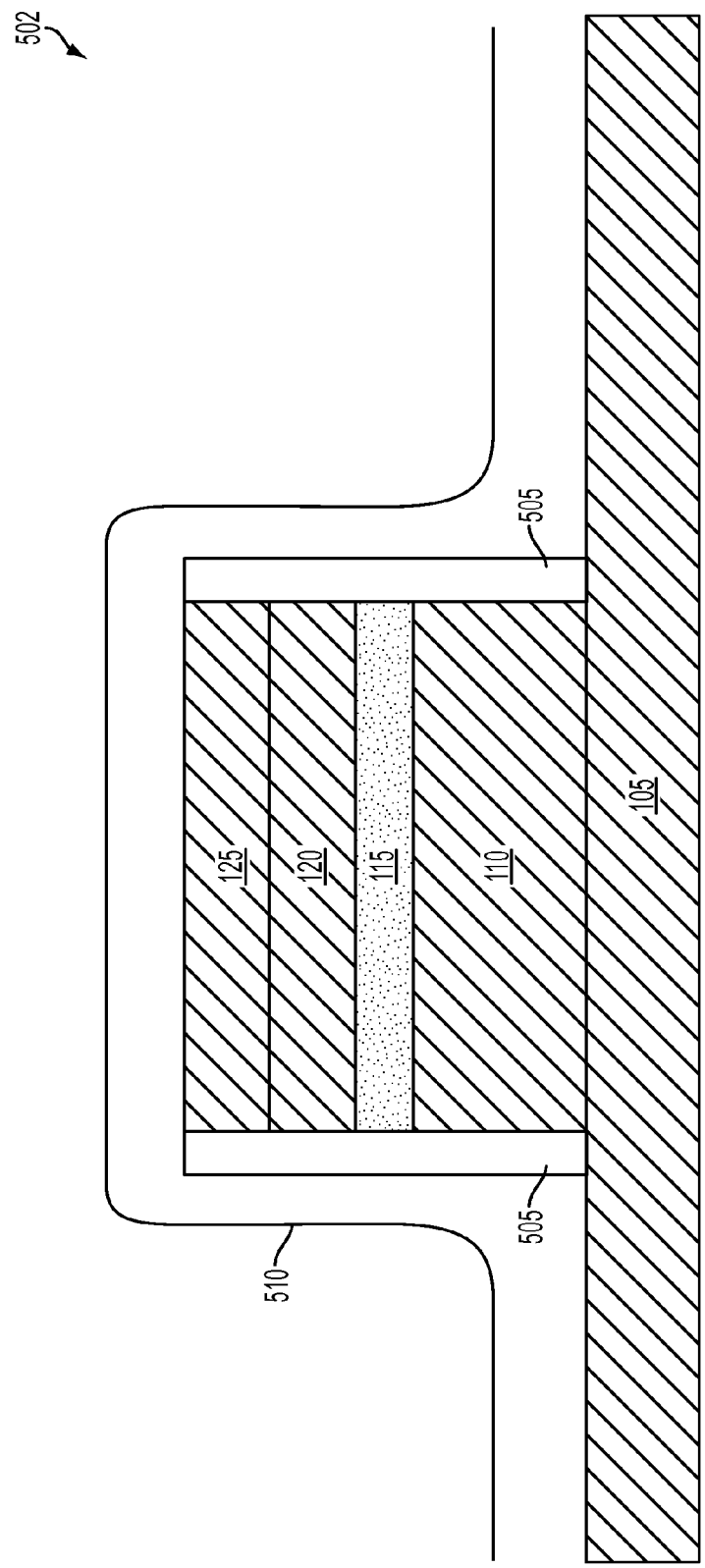
FIG. 5C illustrates an intermediate structure of a thermally assisted magnetic memory cell.

FIG. 4 illustrates a flow chart for a method 400 of fabricating a parallel shunt path in thermally assisted magnetic memory cells in accordance with exemplary embodiments. At block 405, the device (e.g., the MTJ device 100) is patterned according to design specifications for the particular implementation. FIG. 1 illustrates the example of the MTJ device 100 that can be patterned. At block 406, an insulating passivation layer is deposited over the MTJ device 100. FIG. 5A illustrates an intermediate structure 500 after the insulating passivation layer 505 is deposited. At block 407, the insulating passivation layer 505 is selectively etched to clear the insulating passivation layer 505 from the base of the device. For example, reactive ion etching (RIE) can be implemented. FIG. 5B illustrates an intermediate structure 501 after the insulating passivation layer 505 is selectively etched. At block 510, a shorting conductive layer is deposited over the device 100 and the remaining insulating passivation layer 505. FIG. 5C illustrates an intermediate structure 502 after the shorting conductive layer 510 is deposited. Exemplary materials which may be used for the shorting conductive layer 510 are SiX, TaX or TiX, where the X content is adjusted in order to choose the resistivity of the shunt material. Similarly, the insulating material for the insulating passivation layer 505 would be chosen from a similar set of materials, but of composition so that the resistance of the material was much higher than the shunt material.

At block 415, an insulating layer is deposited over the shorting conductive layer 410 to fill the structure 300. FIG. 5D illustrates an intermediate structure 503 after the insulating layer 520 is deposited over the shorting conductive layer 510. Similar to the shorting conductive layer 510, the insulating material for the insulating layer 520 would be chosen from a similar set of materials, but of composition so that the resistance of the material was much higher than the shunt material.

Figure 5E:
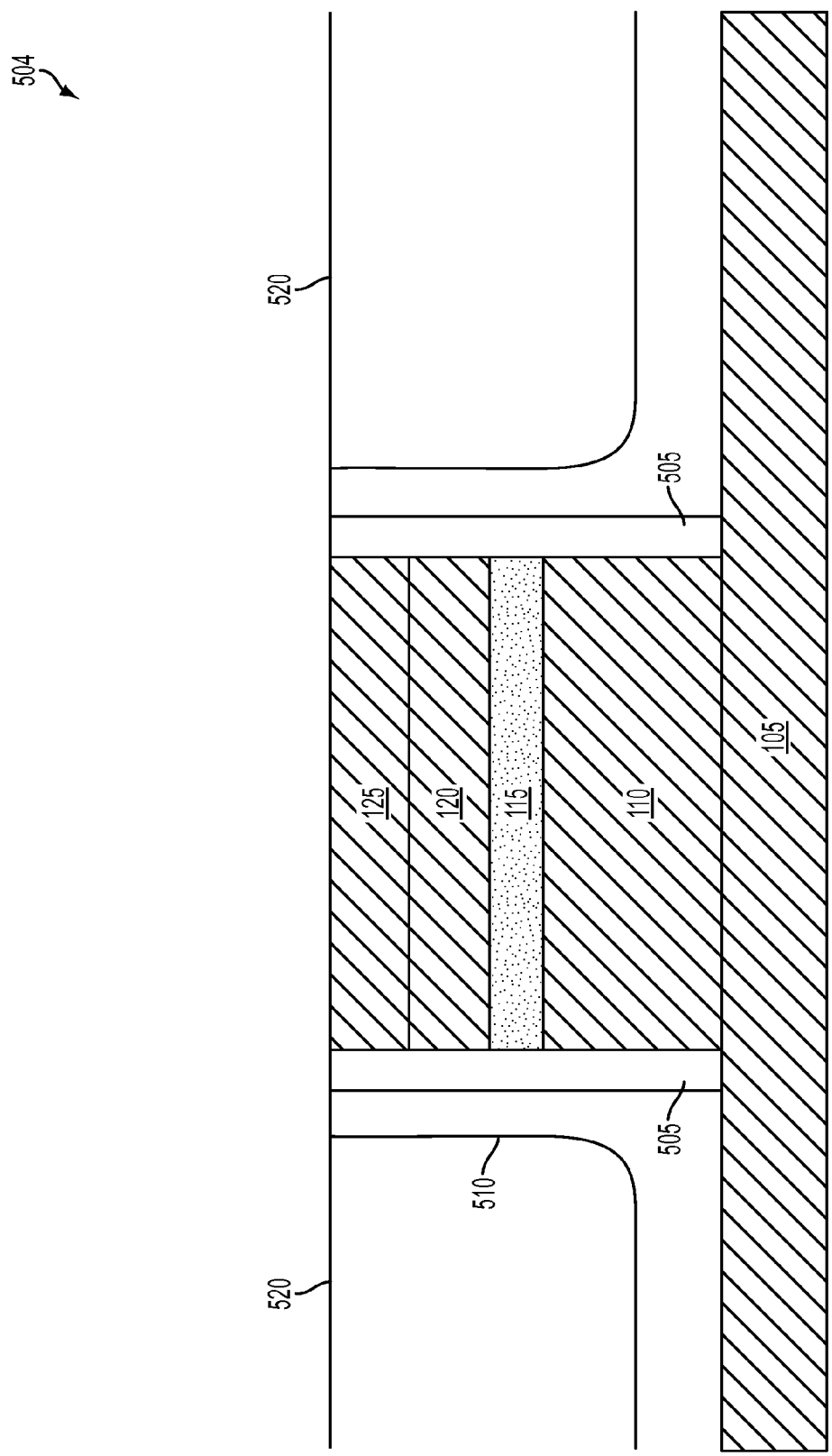
FIG. 5E is an intermediate structure of a thermally assisted magnetic memory cell.
Figure 5F:
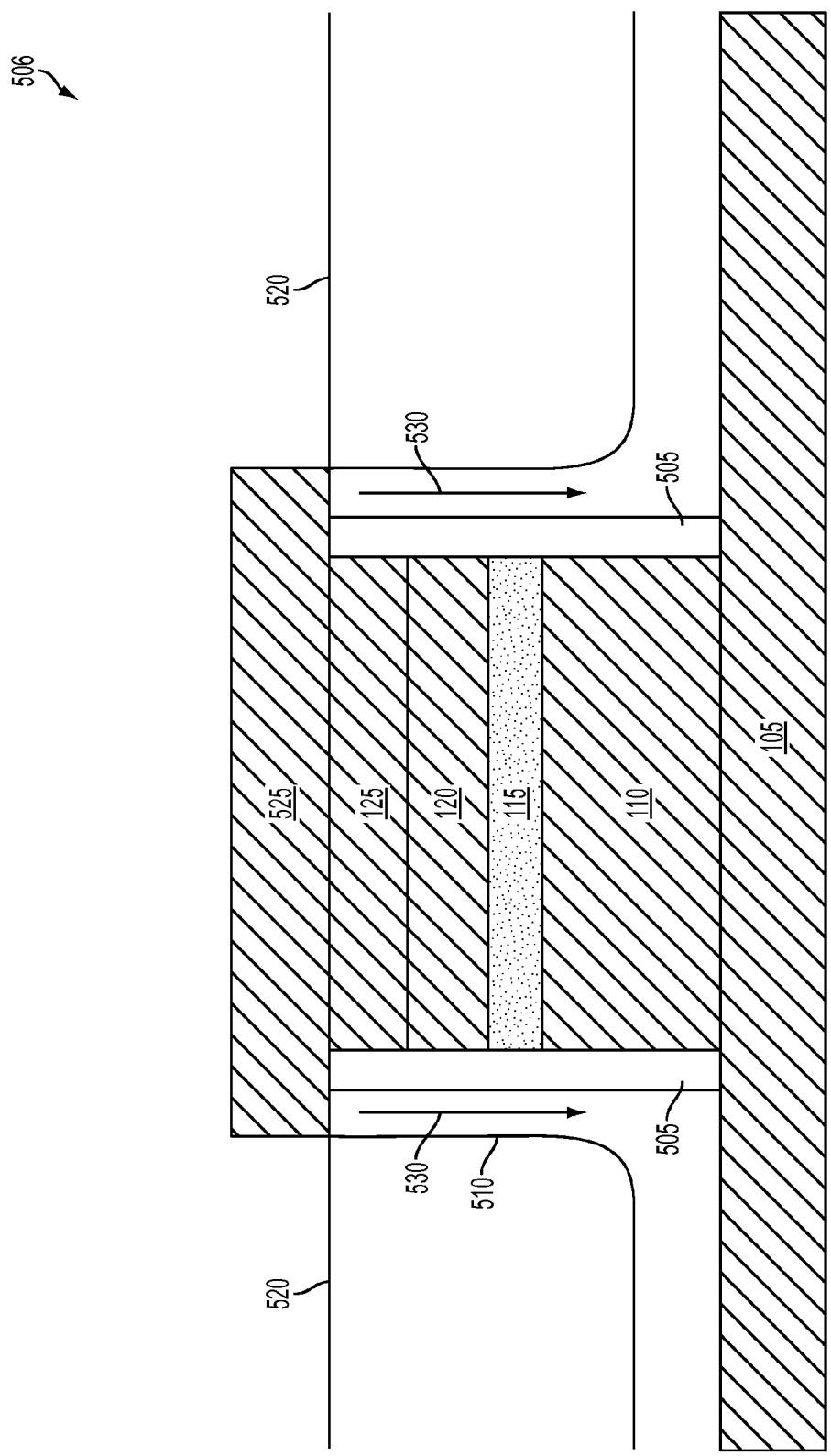
FIG. 5F illustrates a final structure of a thermally assisted magnetic memory cell.

At block 420, the device is exposed to form electrical access to the conductive hard mask 125. For example, at block 420, chemical mechanical polishing/planarization (CMP) can be implemented to smooth the shorting conductive layer 510 and the insulating layer 520 with the combination of chemical and mechanical forces (e.g., a hybrid of chemical etching and free abrasive polishing). FIG. 5E is an intermediate structure 504 after the shorting conductive layer 510 and the insulating layer 520 have been smoothed. At block 425, external contacts can be made to the MTJ device 100. FIG. 5F illustrates a final structure 506 after an external contact 525 has been made to both the conductive hard mask 125 and the shorting conductive layer 510. As illustrated in FIG. 5F the external contact 525 contacts both the shorting conductive layer 510 (i.e., the shunt) and the conductive hard mask 125. The final structure 506 includes a shunt resistance that is now determined by a volume of material of the shorting conductive layer 510, and the shunt resistance can be designed much more repeatedly by adjusting the material resistivity and thickness the shorting conductive layer 510. The shunt material serves primarily to partially short the MTJ device 100, but in a manner controlled by the thickness of the material, and hence provides a known parallel resistance.

In the example structure shown in FIG. 5F, the shunt path is shown by arrows 530. In the example, the shunt resistance is determined by the material and thickness of the shorting conductive layer 510.

In exemplary embodiments, referring to the methods 200, 400 of FIGS. 2 and 4 respectively, the material deposited after the MTJ device 100 is patterned, that is, the shorting conductive layer 310 and the insulating passivation layer 505, respectively, serve to cap the etched edges of the MTJ device 100 and can assist in protecting the MTJ device 100 from degradation after fabrication. In exemplary embodiments, the amount of material deposited in either method 200, 400 is typically between 1 and 10 nm in thickness, so that the thermal properties of the MTJ device 100 are not strongly affected. As a result, the additional power obtained by biased the device at a given voltage V results in significant additional temperature rise.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A thermally assisted magnetic memory cell device, comprising:
   a substrate;
   a first electrode disposed on the substrate;
   a magnetic tunnel junction (MTJ) disposed on the first electrode;
   a second electrode disposed on the MTJ;
   a conductive hard mask disposed on the second electrode; and
   a conductive material disposed on sides of the MTJ, such that the conductive material forms a parallel shunt path coupled to the MTJ, thereby electrically coupling the first and second electrodes.

2. The device as claimed in claim 1 further comprising a contact electrically coupled to the conductive hard mask and to the parallel shunt path.

3. The device as claimed in claim 1 wherein resistance of the parallel shunt path is less than resistance of the MTJ.

4. The device as claimed in claim 1 wherein resistance of the parallel shunt path is selected based on the material of the parallel shunt path.

5. The device as claimed in claim 1 further comprising an insulating passivation layer disposed between the MTJ and the parallel shunt path.

6. The device as claimed in claim 5 wherein resistance of the parallel shunt path is selected based on geometry and material of the parallel shunt path.

7. The device as claimed in claim 1 wherein the parallel shunt path is thermally coupled to the MTJ.

8. A thermally assisted magnetic memory cell device, comprising:
   a magnetic tunnel junction (MTJ) structure;
   a conductive material disposed on sides of the MTJ structure, such that the conductive material forms a parallel shunt path coupled to the MTJ structure; and
   a contact electrically coupled to the MTJ structure and to the parallel shunt path of the conductive material.

9. The device as claimed in claim 8 wherein the MTJ structure includes an MTJ.

10. The device as claimed in claim 9 wherein resistance of the parallel shunt path is less than resistance of the MTJ.

11. The device as claimed in claim 9 wherein resistance of the parallel shunt path is selected based on the material of the parallel shunt path.

12. The device as claimed in claim 9 further comprising an insulating passivation layer disposed between the MTJ structure and the parallel shunt path.

13. The device as claimed in claim 9 wherein the parallel shunt path is thermally coupled to the MTJ structure.

14. The device as claimed in claim 12 wherein resistance of the parallel shunt path is selected based on geometry and material of the parallel shunt path.

* * * * *